US012564009B2

(12) United States Patent
Misaizu

(10) Patent No.: US 12,564,009 B2
(45) Date of Patent: Feb. 24, 2026

(54) CUTTING APPARATUS

(71) Applicant: DISCO CORPORATION, Tokyo (JP)

(72) Inventor: Masanori Misaizu, Tokyo (JP)

(73) Assignee: DISCO CORPORATION, Tokyo (JP)

(*) Notice: Subject to any disclaimer, the term of this patent is extended or adjusted under 35 U.S.C. 154(b) by 448 days.

(21) Appl. No.: 18/295,512

(22) Filed: Apr. 4, 2023

(65) Prior Publication Data

US 2023/0326782 A1 Oct. 12, 2023

(30) Foreign Application Priority Data

Apr. 11, 2022 (JP) .................................. 2022-065079

(51) Int. Cl.
*H01L 21/683* (2006.01)
*B23K 26/38* (2014.01)
*H01L 21/67* (2006.01)
*H01L 21/78* (2006.01)

(52) U.S. Cl.
CPC .......... *H01L 21/6836* (2013.01); *B23K 26/38* (2013.01); *H01L 21/67092* (2013.01); *H01L 21/78* (2013.01); *H01L 2221/68318* (2013.01); *H01L 2221/68327* (2013.01)

(58) Field of Classification Search
CPC ... H01L 21/6836; H01L 21/78; H01L 21/604; H01L 21/67092; H01L 2221/68327; H01L 2221/68318
See application file for complete search history.

(56) References Cited

U.S. PATENT DOCUMENTS 5,972,154 A 10/1999 Konya

FOREIGN PATENT DOCUMENTS

| JP | 09017752 A | 1/1997 |
| JP | 10242083 A | 9/1998 |
| JP | 2016207820 A | 12/2016 |
| JP | 2020088311 A | 6/2020 |

OTHER PUBLICATIONS

Translation of JPH10242083 (Year: 1998).*
Office Action issued in counterpart Japanese patent application No. 2022-065079, dated Nov. 11, 2025.

* cited by examiner

*Primary Examiner* — David A Zarneke
(74) *Attorney, Agent, or Firm* — Greer Burns & Crain Ltd.

(57) ABSTRACT

A cutting apparatus for dividing a wafer that is stuck to an adhesive tape in which the adhesive layer is cured by ultraviolet light and that is supported by an annular frame through the adhesive tape, into individual chips, includes: a holding unit having a frame support section that supports the annular frame, and a wafer table that is formed of a transparent body and supports the wafer; a cutting unit including, in a rotatable manner, a cutting blade for cutting the wafer; and an ultraviolet light applying unit that applies ultraviolet light, the ultraviolet light applying unit being disposed facing the cutting blade in such a manner that the wafer table is interposed therebetween. The ultraviolet light applying unit applies ultraviolet light to a region where the wafer is to be cut by the cutting blade, to form a cured region where the adhesive layer is cured.

7 Claims, 5 Drawing Sheets

CUTTING APPARATUS

BACKGROUND OF THE INVENTION

Field of the Invention

The present invention relates to a cutting apparatus for cutting a wafer to divide the wafer into individual chips.

Description of the Related Art

A wafer formed on a front surface thereof with a plurality of devices such as integrated circuits (ICs) and large scale integration (LSI) circuits in the state of being partitioned by a plurality of intersecting streets (scheduled division lines) is divided into individual chips by a cutting apparatus, and the resultant device chips are utilized for electric appliances such as mobile phones and personal computers.

The wafer is positioned in an opening of an annular frame having the opening for accommodating the wafer, is integrally stuck by an adhesive tape, and is divided into individual chips. After the division, ultraviolet rays are applied to the adhesive tape to lower its adhesive force, so that the individually divided chips can be picked up from the adhesive tape.

However, when the wafer is cut, there is a problem that an adhesive layer of the adhesive tape would cling to a cutting blade and adhere to an upper surface of the wafer, thereby lowering the quality of the divided chips.

In addition, in the case of cutting the wafer stuck to the adhesive tape, there is a problem that, due to the soft adhesive layer of the adhesive tape, the chips would minutely be vibrated at the time of cutting the wafer by the cutting blade, so that fine chipping is generated at the peripheries of the chips, thereby lowering the flexural strength of the chips.

In order to solve the above-described problems, the present applicant has proposed a solution to the above problems in which, before cutting of the wafer, ultraviolet rays are applied to the entire adhesive tape to which the wafer is stuck, to cure the adhesive layer (see Japanese Patent Laid-open No. Hei 10-242083).

SUMMARY OF THE INVENTION

According to the technology described in the above-mentioned Japanese Patent Laid-open No. Hei 10-242083, although the above-described problems are solved by curing of the adhesive layer, excessive application of the ultraviolet rays would lower the adhesive force of the adhesive layer, thereby causing a new problem of scattering of the chips from the adhesive tape and breakage of the chips or the like during cutting. Hence, it may be necessary to apply the ultraviolet rays to such an extent that the adhesive layer would not cling to the cutting blade and that the adhesive force would not be lowered excessively, and it may be necessary to precisely adjust the light quantity of ultraviolet rays, an irradiation period of time, and the like according to the kind, thickness, and the like of the tape, which are problems difficult to cope with.

Accordingly, it is an object of the present invention to provide a cutting apparatus in which the adhesive force of an adhesive tape for chips is favorably maintained, without causing lowering in the quality of the chips or lowering in the flexural strength of the chips.

In accordance with an aspect of the present invention, there is provided a cutting apparatus for cutting a wafer that is positioned in an opening of an annular frame having the opening for accommodating the wafer and is stuck to an adhesive tape in which the adhesive layer is cured by irradiation with ultraviolet light, to divide the wafer into individual chips. The cutting apparatus includes: a holding unit having a frame support section that supports the annular frame, and a wafer table that is formed of a transparent body and supports the wafer; a cutting unit including, in a rotatable manner, a cutting blade for cutting the wafer held by the holding unit; an X-axis feeding mechanism for cutting-feeding the holding unit and the cutting unit relative to each other in an X-axis direction; a Y-axis feeding mechanism for index-feeding the holding unit and the cutting unit relative to each other in a Y-axis direction orthogonal to the X-axis direction; and an ultraviolet light applying unit that applies ultraviolet light, the ultraviolet light applying unit being disposed facing the cutting blade of the cutting unit in such a manner that the wafer table is interposed therebetween. The ultraviolet light applying unit applies ultraviolet light to a region where the wafer is to be cut by the cutting blade, to form a cured region where the adhesive layer is cured.

Preferably, the wafer is a semiconductor wafer formed on a front surface thereof with a plurality of devices in a state of being partitioned by a plurality of crossing streets, and the region to which the ultraviolet light applying unit applies ultraviolet light is a region corresponding to each street.

According to the present invention, the problem that the adhesive layer would cling to the cutting blade at the time of cutting the wafer and would adhere to the chips cut out from the wafer to lower the quality of the chips is solved, and the problem that the chips would be vibrated due to the soft adhesive layer to generate fine chipping at the peripheries of the chips is not caused.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
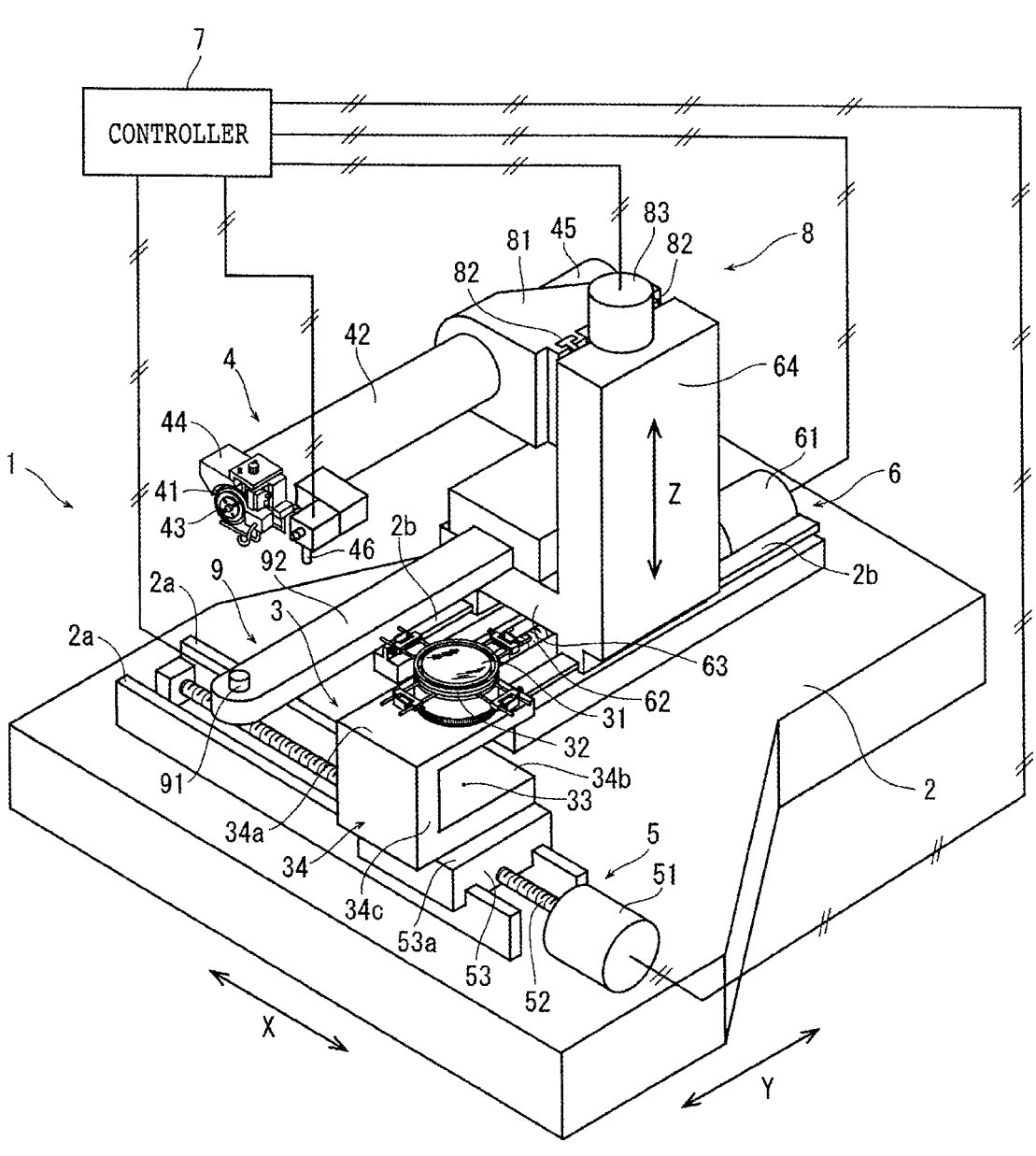
FIG. 1 is a general perspective view of a cutting apparatus according to an embodiment of the present invention.

A cutting apparatus according to an embodiment of the present invention will be described in detail below with reference to the attached drawings. FIG. 1 depicts a perspective view of a cutting apparatus 1 of the present embodiment. The cutting apparatus 1 at least includes a holding unit 3 that holds a workpiece, a cutting unit 4 including, in a rotatable manner, a cutting blade 41 that cuts the workpiece held by the holding unit 3, an X-axis feeding mechanism 5 that is disposed on a base 2 and performs cutting feeding of the holding unit 3 and the cutting unit 4 relative to each other in an X-axis direction, a Y-axis feeding mechanism 6 that is disposed on the base 2 and performs index feeding of the holding unit 3 and the cutting unit 4 relative to each other in a Y-axis direction orthogonal to the X-axis direction, and a controller 7.

The X-axis feeding mechanism 5 converts a rotational motion of a motor 51 into a rectilinear motion through a ball screw 52 which is rotated by the motor 51, and transmits the rectilinear motion to an X-axis direction movable plate 53 with the holding unit 3 fixed to an upper surface 53*a* thereof, thereby advancing and retracting the X-axis direction movable plate 53 along a pair of guide rails 2*a* disposed on the base 2 along the X-axis direction. The Y-axis feeding mechanism 6 converts a rotational motion of a motor 61 into a rectilinear motion through a ball screw 62 which is rotated by the motor 62, and transmits the rectilinear motion to a Y-axis direction movable plate 63 including a vertical wall section 64 for holding the cutting unit 4, thereby advancing and retracting the Y-axis direction movable plate 63 along a pair of guide rails 2*b* disposed on the base 2 along the Y-axis direction.

The cutting unit 4 includes a spindle housing 42 which is disposed on a side surface of the vertical wall section 64 erected on the Y-axis direction movable plate 63 and holds, in a rotatable manner, a spindle 43 having the cutting blade 41 disposed at an end part thereof, a blade cover 44 that covers the cutting blade 41, and a motor 45 that rotationally drives the spindle 43. Further, the cutting unit 4 includes a Z-axis feeding mechanism 8 that moves the cutting blade 41 in a Z-axis direction orthogonal to the X-axis direction and the Y-axis direction through a holding section 81 holding the spindle housing 42, to cutting-in-feed the cutting blade 41 with respect to the workpiece held by the holding unit 3, and an imaging unit 46 that is formed integrally with the spindle housing 42 and images a wafer 10 held by the holding unit 3 described later. Furthermore, the cutting unit 4 includes an ultraviolet light applying unit 9 that is disposed at a position facing the cutting blade 41 of the cutting unit 4 and applies ultraviolet light from below to the wafer 10 held by the holding unit 3 described later.

The Z-axis feeding mechanism 8 includes an unillustrated ball screw disposed along the Z-axis direction, a pair of guide rails 82 disposed in parallel to the ball screw, and a motor 83 for rotating the ball screw. A nut (not illustrated) formed inside the holding section 81 is in screw engagement with the ball screw, and the holding section 81 is held in the manner of being slidable in the Z-axis direction along the guide rails 82. With this configuration, rotation of the ball screw by the motor 82 causes the spindle housing 42 to be moved in the Z-axis direction while being guided along the guide rails 82 together with the holding section 81, and the cutting blade 41 is cutting-in-fed in the Z-axis direction.

The ultraviolet light applying unit 9 includes a support plate 92 that is disposed on the Y-axis direction movable plate 63 and that extends in the Y-axis direction. An ultraviolet (UV) laser oscillator 91 that emits ultraviolet light LB is disposed at a tip part of the support plate 92. The UV laser oscillator 91 faces the cutting blade 41 in the Z-axis direction, is positioned substantially directly below the cutting blade 41, and applies the ultraviolet light LB from below to a region which is to be cut by the cutting blade 41. Note that the position to which the ultraviolet light LB is applied by the UV laser oscillator 91 in the present embodiment is set to be deviated from a lower end position of the cutting blade 41 in the X-axis direction, and the ultraviolet light LB can preceedingly be applied to the region to be cut by the cutting blade 41 (described in detail later). The UV laser oscillator 91 includes an unillustrated condenser lens, which concentrates the ultraviolet light LB applied by the UV laser oscillator 91 and applies the ultraviolet light LB to a predetermined region of the wafer 10 held by a wafer table 32 which will be described later. The UV laser oscillator 91 is connected to and controlled by the controller 7. The UV laser oscillator 91 and the cutting blade 41 of the cutting apparatus 1 in the present embodiment are configured not to be moved relative to each other in the X-axis direction or the Y-axis direction, and, even in the case where the cutting unit 4 and the holding unit 3 are moved relative to each other by the X-axis feeding mechanism 5 and the Y-axis feeding mechanism 6, the relative positions of the position to which the ultraviolet light LB is applied by the UV laser oscillator 91 and a tip position of a cutting edge of the cutting blade 41 are not varied. Note that the present invention is not limited to the configuration in which the UV laser oscillator 91 and the cutting blade 41 are not moved relative to each other in the X-axis direction or the Y-axis direction, and they may be configured to be moved relative to each other (described later).

Figures 2A, 2B:
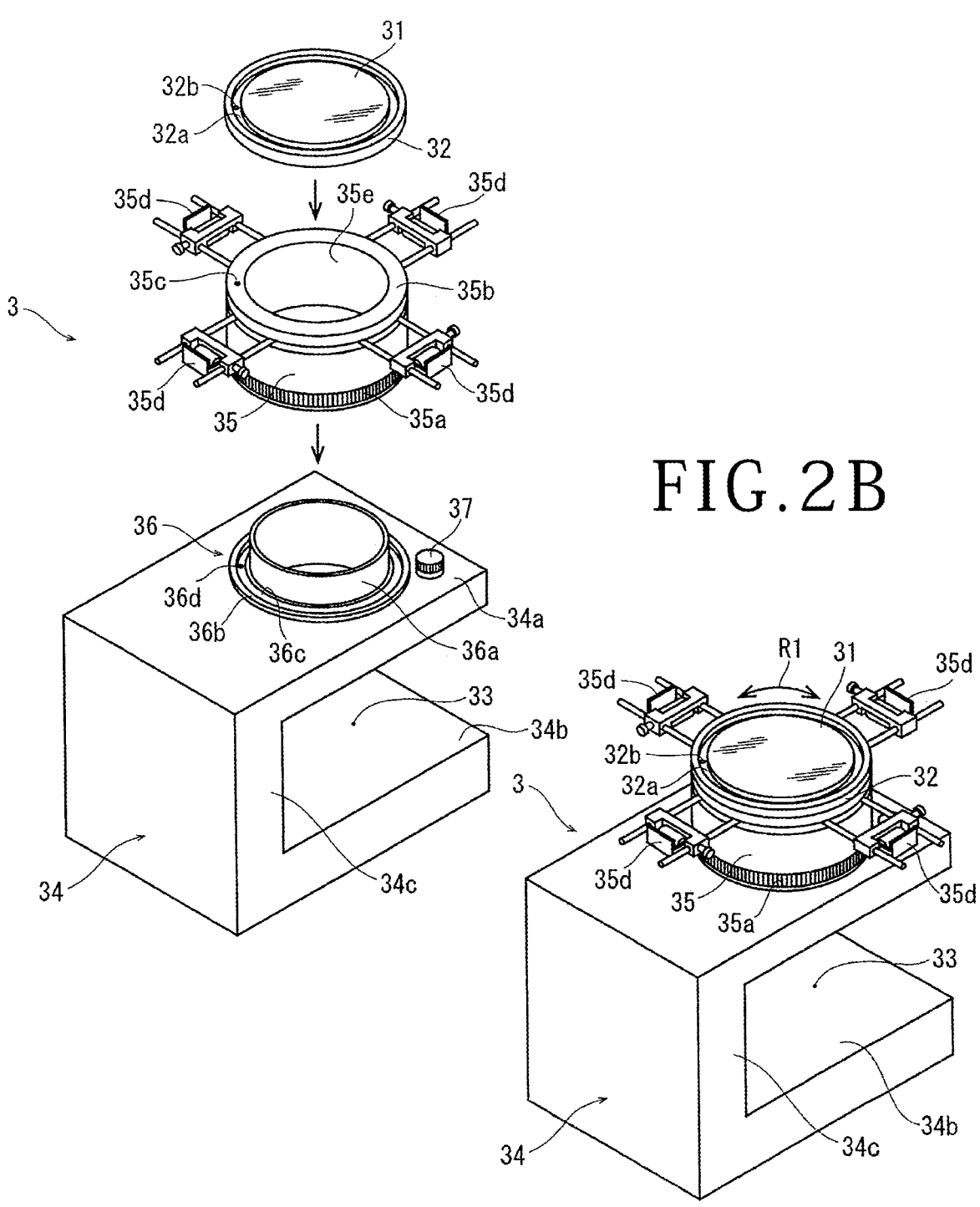
FIG. 2A is an exploded perspective view of a holding unit disposed in the cutting apparatus depicted in FIG. 1.
FIG. 2B is a perspective view of the holding unit assembled according to the configuration depicted in FIG. 2A.

With reference to FIG. 2A, the holding unit 3 of the present embodiment will be described more specifically. The holding unit 3 includes the wafer table 32 that is formed of a light-transmitting transparent body and that has a holding surface 31 defined by the X-axis direction and the Y-axis direction and holding the workpiece, and a frame body 34 that supports the wafer table 32. The wafer table 32 is mounted on and held by an upper surface 34*a* of the frame body 34 through a cylindrical support tube 35. The wafer table 32 is formed of, for example, a glass plate, an acrylic resin plate, or the like. The frame body 34 is, for example, formed in a roughly U shape including the upper surface 34*a*, a lower surface 34*b*, and a vertical wall 34*c* connecting the upper surface 34*a* and the lower surface 34*b*, and defines a space 33 on an opposite side of the holding surface 31 of the wafer table 32.

At the upper surface 34*a* of the frame body 34 is formed a support tube holding section 36 that holds, in a rotatable manner, the support tube 35 supporting the wafer table 32. The support tube holding section 36 includes a cylindrical section 36*a* to be inserted into an inner wall 35*e* of the support tube 35, an annular sliding section 36*b* which is formed in such a manner as to surround the cylindrical section 36*a* at the upper surface 34*a* of the frame body 34 where the cylindrical section 36*a* is formed and on which the support tube 35 is to be slidably mounted, a first suction groove 36*c* formed between the cylindrical section 36*a* and the sliding section 36*b*, and a first suction hole 36*d* formed in a bottom part of the first suction groove 36*c*. The first suction hole 36*d* is connected to an unillustrated suction source and forms a negative-pressure region in the first suction groove 36*c*. An upper surface of the sliding section 36*b* is coated with fluororesin, so that progress of abrasion of the upper surface is restrained, and favorable sliding characteristics are maintained for a long period of time.

An outer circumference on a lower end side of the support tube 35 is formed with engagement grooves 35*a* which are to be engaged with a rotation-transmitting section 37 formed in the frame body 34, and, by rotating the rotation-transmitting section 37 by an unillustrated step motor, in a state in which the support tube 35 is mounted on the cylindrical section 36a at the upper surface 34a of the frame body 34 in an inserting manner, as depicted in FIG. 2B, the support tube 35 can be rotated in directions indicated by an arrow R1. As depicted in FIG. 2A, an upper surface 35b of the support tube 35 is formed with a second suction hole 35c. The second suction hole 35c is connected to the first suction groove 36c of the support tube holding section 36 through a communication passage (not illustrated) communicating vertically in a wall section constituting the support tube 35, in a state in which the support tube 35 is mounted on the upper surface 34a of the frame body 34, and, by operating the suction source, a negative pressure can be made to act on the second suction hole 35c formed in the upper surface 35b of the support tube 35. On an upper end side of the support tube 35, four frame support sections 35d are disposed at even intervals. The frame support sections 35d function as clamps that support an annular frame F supporting the wafer 10 described later by grasping the annular frame F when the wafer 10 is to be supported.

As depicted in FIG. 2A, an annular second suction groove 32a is formed in an outer circumferential region of the holding surface 31 constituting the wafer table 32. A vertically penetrating third suction hole 32b is formed in a bottom part of the second suction groove 32a. In the case of mounting and holding the wafer table 32 on the upper surface 35b of the support tube 35, the mounting is conducted in such a manner that the third suction hole 32b coincides with the second suction hole 35c of the support tube 35. By assembling the configurations depicted in FIG. 2A, the holding unit 3 depicted in FIG. 2B is formed. By operating the unillustrated suction source in the state depicted in FIG. 2B, a negative pressure can be generated in the second suction groove 32a on the wafer table 32 through the first suction hole 36d, the second suction hole 35c, and the third suction hole 32b.

Now, though illustration is omitted, a position sensor is disposed in the vicinity of each of the X-axis feeding mechanism 5, the Y-axis feeding mechanism 6, the Z-axis feeding mechanism 8, and the engagement grooves 35a of the support tube 35. The position of the holding unit 3 in the X-axis direction, the positions of the cutting unit 4 in the Y-axis direction and the Z-axis direction, and the rotational position of the wafer table 32 are detected accurately with use of the position sensors, and the X-axis feeding mechanism 5, the Y-axis feeding mechanism 6, the Z-axis feeding mechanism 8, and the rotation-transmitting section 37 are driven based on signals designated by the controller 7, so that the wafer table 32 of the holding unit 3 and the cutting blade 41 of the cutting unit 4 can accurately be positioned at desired positions.

The controller 7 includes a computer, which includes a central processing unit (CPU) that performs arithmetic processing according to a control program, a read only memory (ROM) that stores the control program and the like, a readable-writable random access memory (RAM) for temporarily storing arithmetic processing results and the like, an input interface, and an output interface (detailed illustration is omitted). Note that, while the controller 7 is depicted outside the cutting apparatus 1 in FIG. 1 for convenience of explanation, the controller 7 in practice is disposed at a part of the inside of the cutting apparatus 1. The cutting apparatus 1 of the present embodiment is generally configured as above-described, and operations and effects thereof will be described below.

Figure 3:
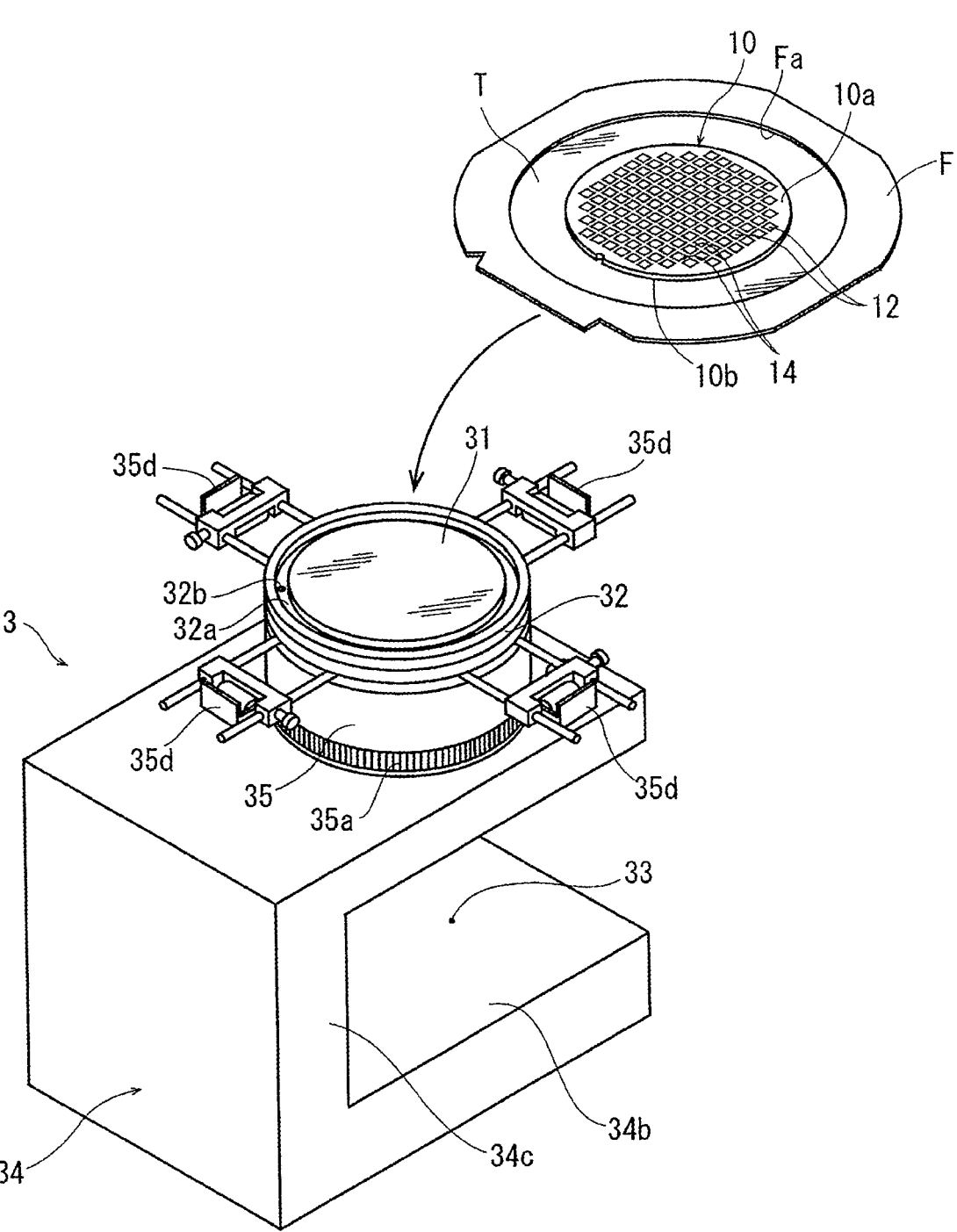
FIG. 3 is a perspective view depicting a manner in which a wafer is mounted on the holding unit depicted in FIGS. 2A and 2B.

The workpiece to be processed by the cutting apparatus 1 in the present embodiment is, for example, as depicted in FIG. 3, a semiconductor wafer 10 formed on a front surface 10a thereof with a plurality of devices 12 partitioned by a plurality of intersecting streets 14. The wafer 10 is positioned in an opening Fa of the annular frame F having the opening Fa for accommodating the wafer 10 and is integrally stuck to and supported by an adhesive tape T in which an adhesive layer on its surface is cured ty irradiation with ultraviolet light.

At the time of processing the above-described wafer 10, as depicted in FIG. 3, the wafer 10 supported by the annular frame F is mounted on the holding surface 31 of the wafer table 32 of the holding unit 3, with the adhesive tape T side (back surface 10b side) directed downward. Next, the unillustrated suction source is operated to generate a negative pressure in the second suction groove 32a through the third suction hole 32b, so that the wafer 10 is held under suction on the holding surface 31 of the wafer table 32, and the annular frame F is supported by the frame support sections 35d, thereby fixing the wafer 10.

After the wafer 10 is fixed to the holding unit 3, the X-axis feeding mechanism 5 depicted in FIG. 1 is operated to move the holding unit 3 together with the X-axis direction movable plate 53 in the X-axis direction, to thereby position the holding unit 3 directly under the imaging unit 46. The front surface 10a of the wafer 10 is imaged by use of the imaging unit 46, the positions of the streets 14 formed on the front surface 10a of the wafer 10 are detected, and the rotation-transmitting section 37 disposed on the frame body 34 is operated to rotate the wafer 10, thereby matching the streets 14 extending in a first direction to the X-axis direction. Information concerning the positions of the streets 14 thus detected is sent to and stored in the controller 7.

Based on the position information concerning the streets 14 detected by the imaging unit 46, the X-axis feeding mechanism 5 and the Y-axis feeding mechanism 6 are operated to position the cutting blade 41 of the cutting unit 4 on an upper side of a processing start position of a predetermined one of the streets 14 extending in the first direction. In this case, the UV laser oscillator 91 of the ultraviolet light applying unit 9 of the present embodiment is disposed at a position facing the cutting blade 41 and on a lower side of the cutting blade 41, and, when the frame body 34 is positioned directly under the cutting blade 41, the UV laser oscillator 91 of the ultraviolet light applying unit 9 is positioned inside the space 33 defined by the frame body 34.

Figure 4:
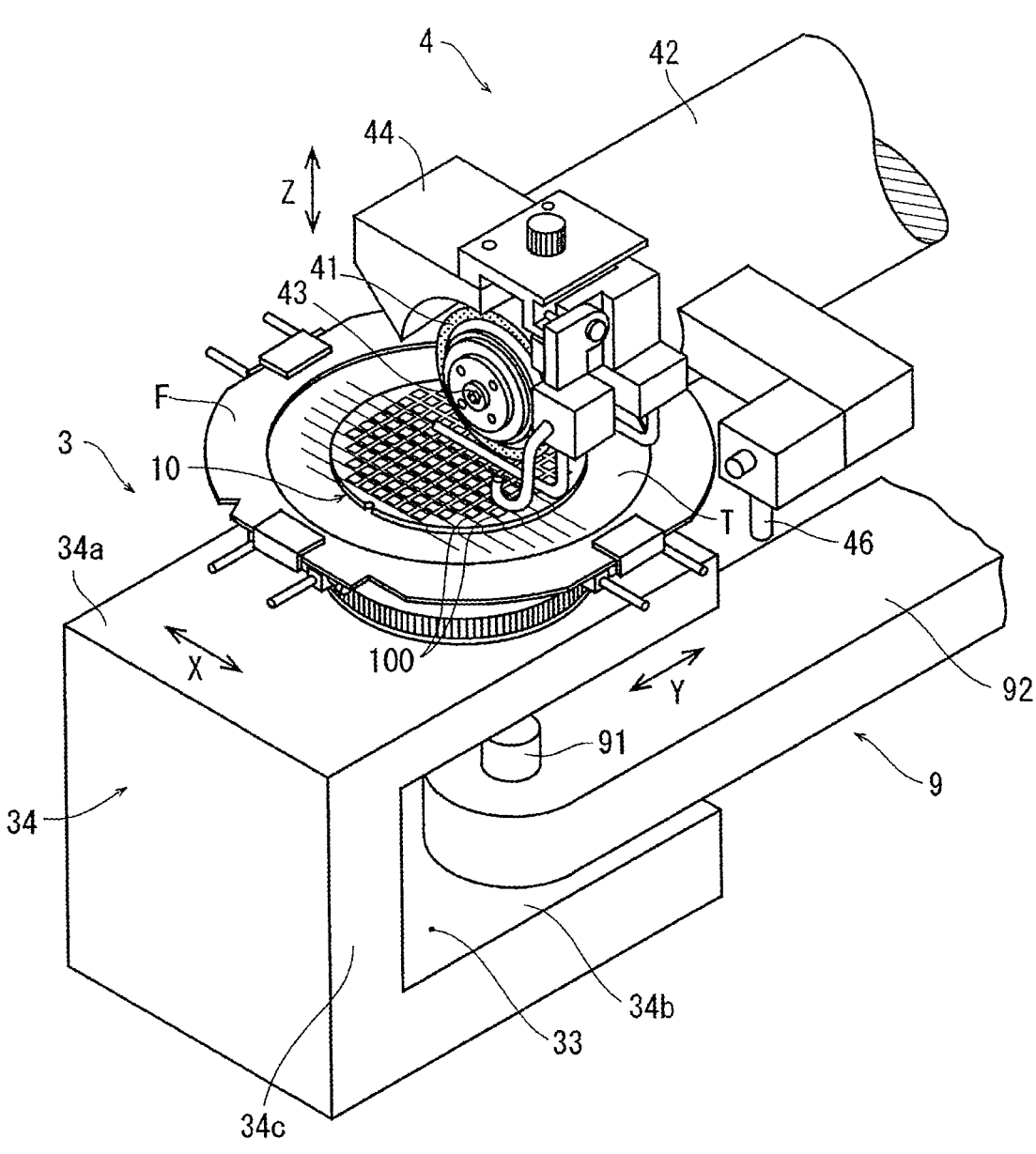
FIG. 4 is a perspective view depicting a manner in which a cutting step for the wafer is carried out.

After the cutting blade 41 is positioned on the upper side of the processing start position of the street 14 on the wafer 10, the Z-axis feeding mechanism 8 is operated to lower the cutting unit 4 according to a prestored thickness of the wafer 10 or the thickness of the wafer 10 detected in an alignment step. As depicted in FIG. 4, the cutting blade 41 is cutting-in-fed into the street 14 of the wafer 10 while the wafer 10 is processing-fed in the X-axis direction, to thereby form a cut groove 100 along the street 14.

Figure 5A:
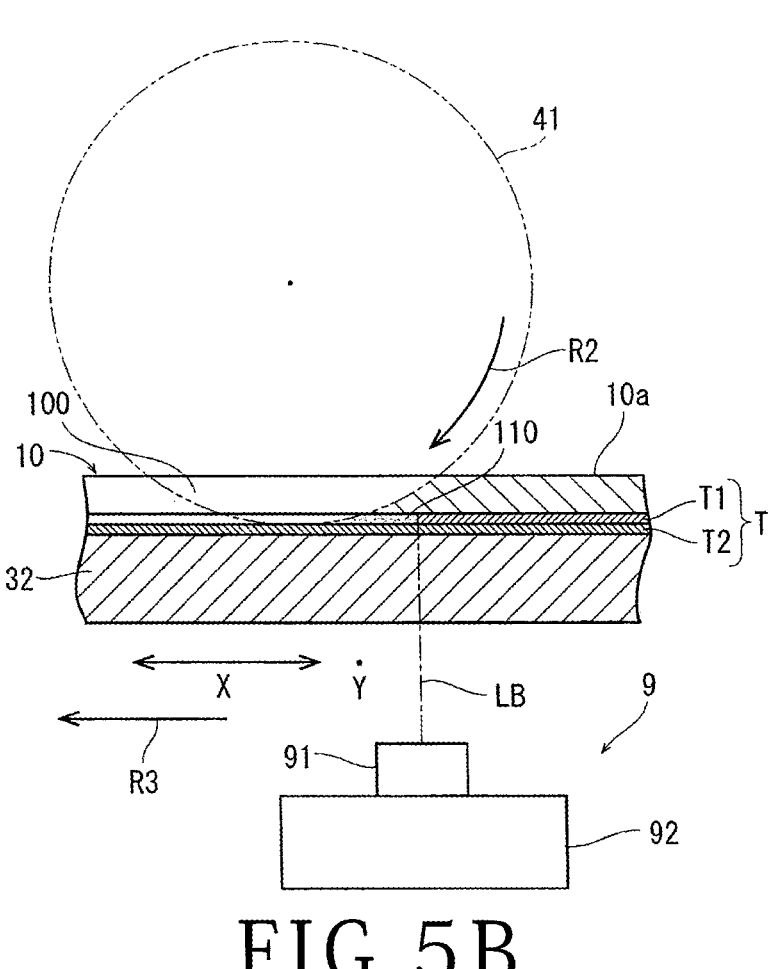
FIG. 5A is a sectional view depicting, in an enlarged form, a part of the manner depicted in FIG. 4.
Figure 5B:
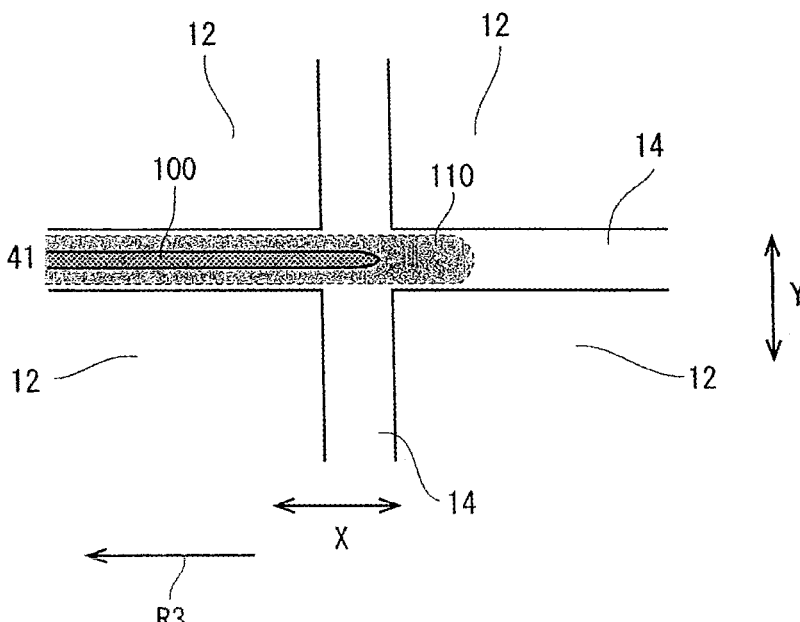
FIG. 5B is a plan view depicting, in an enlarged form, a part of the manner depicted in FIG. 4.

Here, as understood from FIG. 5A depicting an enlarged sectional view of a part of the above-described embodiment, when the cutting blade 41 is rotated in a direction indicated by an arrow R2 and is cutting-in-fed while the wafer 10 is moved in a direction indicated by an arrow R3 which is the X-axis direction, ultraviolet light LB is precedingly applied through the wafer table 32 formed of the transparent body, along the region where the wafer 10 is to be cut by the cutting blade 41, namely, the region of the adhesive tape T corresponding to the street 14, from the UV laser oscillator 91 of the ultraviolet light applying unit 9. Since the adhesive tape T has a structure in which an adhesive layer T1 to be cured by irradiation with ultraviolet light LB is formed on a surface of a resin tape T2 not having an adhesive force, the region of the adhesive layer T1 that is irradiated with ultraviolet light LB is cured by the action of the ultraviolet light LB, to form a cured region 110 in the region corresponding to the street 14, as depicted in a plan view of FIG. 5B. As has been described above, the UV laser oscillator 91 is disposed facing the cutting blade 41 and is set to be located at a position (right side in FIG. 5A) deviated in the X-axis direction from the lower end position of the cutting blade 41. As a result, the region of the adhesive tape T corresponding to the street 14 where the cut groove 100 is to be formed by the cutting blade 41 is cured by irradiation with ultraviolet light LB before being subjected to cutting.

Note that, in the above-described embodiment, an example has been described in which the relative positions of the cutting blade 41 of the cutting unit 4 and the UV laser oscillator 91 of the ultraviolet light applying unit 9 are not moved relative to each other in the X-axis direction or the Y-axis direction and in which the relative positions of the cutting blade 41 and the UV laser oscillator 91 are coincident in the Y-axis direction, and an example has been described in which the region of the adhesive layer T1 of the adhesive tape T corresponding to the street 14 along which cutting is being carried out is cured by irradiation with ultraviolet light LB simultaneously with the cutting, but the present invention is not limited to this configuration. In other words, as another example in which the UV laser oscillator 91 is disposed facing the cutting blade 41, the region of the adhesive layer T1 of the adhesive tape T that is adjacent to the street 14 subjected to cutting by the cutting blade 41 and that corresponds to an unprocessed street 14 to be cut next may precedingly be irradiated with ultraviolet light LB, to cure the adhesive layer T1 of the adhesive tape T. In that case, it is preferable that a position adjusting mechanism for adjusting the position of irradiation by the UV laser oscillator 91 in the Y-axis direction be disposed in the ultraviolet light applying unit 9, and the irradiation position in the Y-axis direction finely be adjusted. Further, by disposing a position adjusting mechanism for adjusting the position of irradiation by the UV laser oscillator 91 relative to the cutting blade 41 in the X-axis direction, it is also possible, at the time of curing the region of the adhesive layer T1 of the adhesive tape T corresponding to the street 14 where cutting is being carried out, by irradiation with ultraviolet light LB simultaneously with the cutting, to adjust the position in the X-axis direction where the adhesive layer T1 is precedingly cured.

Further, the cutting blade 41 of the cutting unit 4 is index-fed onto the street 14 extending in the first direction which is adjacent in the Y-axis direction to the street 14 having been formed with the cut groove 100 and which has not yet been formed with the cut groove 100, and the cut groove 100 is formed while forming the cured region 110 by applying the ultraviolet light LB to the adhesive layer T1 of the adhesive tape T in the region corresponding to the street 14, in a manner similar to the above. These operations are repeated, so that the cut grooves 100 are formed along all the streets 14 along the first direction. Next, the rotation-transmitting section 37 is operated to rotate the wafer table 32 by 90 degrees, thereby matching the second direction orthogonal to the first direction in which the cut grooves 100 have previously been formed, to the X-axis direction, and the cut grooves 100 are formed along all the streets 14 formed on the wafer 10 while forming the above-described cured regions 110 in the adhesive layer T1 by conducting the above-described cutting for all the streets 14 extending in the second direction that have newly been matched to the X-axis direction. By carrying out such a dividing step, the wafer 10 is divided along the streets 14 to form chips of devices 12. When this dividing step has been completed, the chips are accommodated in an unillustrated cassette, or in an as-is state, are conveyed to an apparatus for carrying out the next step (for example, pick-up step).

In the above-described embodiment, the regions of the adhesive tape T corresponding to the streets where the cut grooves 100 are to be formed are irradiated with the ultraviolet light LB, to form the cured regions 110 in which the adhesive layer T1 is cured. As a result, a problem that the adhesive layer T1 would cling to the cutting blade 41 and adhere to the individually divided devices 12 at the time of forming the cut grooves 100 with the result of lowering in quality, and a problem that the individually divided devices 12 would be vibrated due to the soft adhesive layer T1 to generate fine chipping at the peripheries are solved. In addition, in the present embodiment, while the cured regions 110 are formed in the regions corresponding to the streets 14 to be cut by the cutting blade 41, uncured regions not irradiated with the ultraviolet light LB are provided in the regions not to be cut by the cutting blade 41, so that the adhesive force of the adhesive layer T1 is maintained without lowering in the uncured regions and, hence, a problem that the devices 12 becoming the individually divided chips would be scattered during the cutting is not caused. Further, since the ultraviolet light LB in the present embodiment is applied from below to the adhesive tape T through the wafer table 32 formed of the light-transmitting transparent body, the adhesive layer T1 of the adhesive tape T can be cured accurately and efficiently to form the cured regions 110.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus for cutting a wafer that is positioned in an opening of an annular frame having the opening for accommodating the wafer and is stuck to an adhesive tape in which the adhesive layer is cured by irradiation with ultraviolet light, to divide the wafer into individual chips, the cutting apparatus comprising:

a holding unit having a frame support section that supports the annular frame, and a wafer table that is formed of a transparent body and supports the wafer;

a cutting unit including, in a rotatable manner, a cutting blade for cutting the wafer held by the holding unit;

an X-axis feeding mechanism for cutting-feeding the holding unit and the cutting unit relative to each other in an X-axis direction;

a Y-axis feeding mechanism for index-feeding the holding unit and the cutting unit relative to each other in a Y-axis direction orthogonal to the X-axis direction; and an ultraviolet light applying unit that applies ultraviolet light, the ultraviolet light applying unit being disposed facing the cutting blade of the cutting unit in such a manner that the wafer table is interposed therebetween, wherein the ultraviolet light applying unit applies ultraviolet light to a region where the wafer is to be cut by the cutting blade, to form a cured region where the adhesive layer is cured, such that a UV laser oscillator of the ultraviolet light applying unit precedes the cutting blade in a direction of cutting of the cutting blade.

2. The cutting apparatus according to claim 1, wherein the wafer is a semiconductor wafer formed on a front surface thereof with a plurality of devices in a state of being partitioned by a plurality of crossing streets, and the region to which the ultraviolet light applying unit applies ultraviolet light is a region corresponding to each street.

3. The cutting apparatus according to claim 1, wherein the frame support section is disposed on an upper end of a cylindrical support tube, such that the cylindrical support tube is mounted on a cylindrical section at an upper surface of the frame body in an inserting manner.

4. The cutting apparatus according to claim 1, wherein the UV laser oscillator is positioned substantially directly below the cutting blade.

5. The cutting apparatus according to claim 1, wherein the UV laser oscillator is positioned below the wafer and the cutting blade is position above the wafer.

6. The cutting apparatus according to claim 1, wherein positions of the cutting blade and the UV laser oscillator are not moved relative to each other in the X-axis direction or the Y-axis direction and wherein the relative positions of the cutting blade and the UV laser oscillator are coincident in the Y-axis direction.

7. The cutting apparatus according to claim 1, wherein a position of the UV laser oscillator relative to the cutting blade in the X-axis direction is adjustable.

\*   \*   \*   \*   \*